United States Patent [19]
Davies

[11] Patent Number: 5,210,512
[45] Date of Patent: May 11, 1993

[54] MAGNET ASSEMBLY

[75] Inventor: Francis Davies, Oxford, Great Britain

[73] Assignee: Oxford Magnet Technology Ltd., Great Britain

[21] Appl. No.: 731,273

[22] Filed: Jul. 17, 1991

[30] Foreign Application Priority Data

Jul. 24, 1990 [GB] United Kingdom ............... 9016183

[51] Int. Cl.$^5$ .............................................. H01F 1/00
[52] U.S. Cl. .................................... 335/216; 505/705
[58] Field of Search ................ 335/216; 505/705, 872, 505/879, 880, 891, 892, 898

[56] References Cited

U.S. PATENT DOCUMENTS

| | | | |
|---|---|---|---|
| 3,859,566 | 1/1975 | Gassong et al. | 335/216 |
| 4,559,576 | 12/1985 | Ries | 335/216 |
| 4,689,707 | 8/1987 | Schwall | 335/216 |
| 4,760,365 | 7/1988 | Bailey et al. | 335/216 |
| 4,812,796 | 3/1989 | Ries | |
| 4,926,289 | 5/1990 | Reichert | |

FOREIGN PATENT DOCUMENTS

| | | |
|---|---|---|
| 0144171 | 6/1985 | European Pat. Off. |
| 0350264 | 1/1990 | European Pat. Off. |
| WO9003038 | 3/1990 | PCT Int'l Appl. |
| 2174247 | 10/1986 | United Kingdom |
| 2229862 | 10/1990 | United Kingdom |

Primary Examiner—Lincoln Donovan
Attorney, Agent, or Firm—Hill, Steadman & Simpson

[57] ABSTRACT

A magnet assembly suitable for use in magnetic resonance imaging has a first superconducting coil assembly for generating a first magnetic field and a second superconducting coil assembly for generating a second magnetic field. The first and second superconducting coil assemblies are connected in series and each generate magnetic fields whose corresponding components are of substantially the same order of magnitude. The assemblies are arranged so that a resultant, uniform magnetic field is generated in a working volume, and the second magnetic field substantially opposes the first magnetic field externally of the magnet assembly. The resultant magnetic field prevailing externally of the magnet assembly is maintained within preset limits during normal operation of the assembly in which the current in the superconducting coils is substantially constant. The assembly further includes at least one electrically conductive ring disposed outside of the working volume, which is sized and positioned so that current induced in the ring during a transient condition, in which the current in the superconducting coils is changing, such as in the event of a quench, creates a magnetic field which acts to oppose the magnetic fields created by the currents induced in conductive parts of the magnet assembly. This causes the resultant magnetic field prevailing externally of the magnet assembly to remain substantially within or close to the preset limits for normal operation.

11 Claims, 5 Drawing Sheets

Maximum Extent of 0.5mT Contour

MAGNET ASSEMBLY

BACKGROUND OF THE INVENTION

1. Field of the Invention

The invention relates to a magnet assembly and particularly to an active-shield superconducting magnet assembly.

2. Description of the Prior Art

An active-shield assembly is one in which an inner coil system and an outer coil system are connected in series to create magnetic fields in opposing directions so that a strong uniform magnetic field is created at the center of the coil systems, but the stray field prevailing outside the coil systems is very small.

Such an assembly is described in European Patent Publication No. 0144171, the contents of which are incorporated herein by reference. In the assembly described in EP-A-0144171, the coil systems creating the opposing magnetic fields are wound from superconducting wire. Superconducting coil systems are used in order to achieve strength and high precision of the magnetic field created in the center of the coil systems. A prime application of these magnet assemblies is in NMR (nuclear magnetic resonance) imaging where these qualities are of vital importance. The superconducting condition of the coils is achieved by cooling the coils to very low temperatures, of the order of 4.2 K, using cryogenic techniques. In the superconducting condition, the wires can carry a very high current with negligible energy losses in the wire.

A coil in a superconducting state can convert to a normal conducting state, the transition being commonly referred to as a quench. A quench may occur unintentionally due to local disturbances or structural deficiencies or it can be induced intentionally (for example, by means of local electrical heaters) as a way of rapidly reducing the magnetic field. This might be needed for example in a case where it is necessary to give urgent treatment to a patient undergoing an NMR procedure in the magnet assembly. When a quench occurs, there is a rapid increase in resistance in the quenched part of the coil which causes the energy stored in the coil system to be converted into heat. The heat is conducted to adjacent parts of the coil, causing these parts to quench. As an increasingly large part of the coil is quenched, the temperature associated with the heat energy increases, causing the resistance of the coil to rise further and accelerating the quench process until all the stored magnetic energy is converted into heat. This can occur extremely quickly, typically in about 10 to 20 seconds.

The increased resistance in the coils causes the current carried by the coils to decay. As the current in the coils decays, the magnetic field provided by the coils alters rapidly. In known magnet assemblies, the magnets are wound onto formers which are generally of aluminum, and the coils are housed within radiation shielding casings which are suspended in a cryostat housing. The casings and housing are formed of a material having a high thermal conductivity such as aluminum and tend also as a result to have a high electrical conductivity. The altering magnetic field couples with the electrically conductive components in the magnet assembly and cryostat structure. In particular, it couples strongly with the formers on which the coils are wound, and the radiation shielding casings within the cryostat. This magnetic coupling induces currents in these components, which currents are sufficiently large to generate significant magnetic fields.

As described in EP-A-0144171 the coils of an active-shield magnet assembly are designed not only to produce a uniform magnetic field at the center of the assembly but also to produce an external magnetic field which is as low as possible as close as possible to the assembly. The external magnetic field is termed herein the "stray field" and is commonly specified in terms of an ellipsoidal or cylindrical volume outside which the magnetic field due to the magnet assembly nowhere exceeds a specified level. This provides a way of denoting a safety zone a certain distance from the magnet.

The other components of the magnet assembly are, however, designed according to normal thermal and structural considerations, so that the distribution of currents induced in them during a quench is uncontrolled. In normal circumstances this is not a problem, since no currents flow in these components during the steady state operating condition. During a quench, however, significant, uncontrolled currents can be induced as explained above. The magnetic field created by the induced currents upsets the balance between the central magnetic coils and the shielding magnetic coils. The result can be a temporary but significant increase in the stray field during a quench, which could present a risk to people or equipment located in the safety zone close to the positions for which a steady maximum stray field value is specified under normal circumstances. This is clearly undesirable, particularly in hospitals where sensitive equipment might be located in the nominal safety zone.

SUMMARY OF THE INVENTION

In accordance with the principles of the present invention there is provided a magnet assembly having a first superconducting coil assembly for generating a first magnetic field and a second superconducting coil assembly for generating a second magnetic field. The second superconducting coil assembly is electrically connected in series with the first superconducting coil assembly. The first and second superconducting coil assemblies each generate, in use, magnetic fields whose corresponding components are of substantially the same order of magnitude. The assemblies are arranged such that a resultant, uniform magnetic field is generated in a working volume, and the second magnetic field substantially opposes the first magnetic field externally of the magnet assembly. The resultant magnetic field prevailing externally of the magnet assembly is maintained within preset limits during normal operation of the assembly in which the current in the superconducting coils is substantially constant. The assembly further includes at least one ring formed of an electrically conductive material and disposed outside the working volume, the ring being sized and positioned so that the current induced in the ring during a transient condition in which the current in the superconducting coils is changing creates a magnetic field which acts to oppose magnetic fields created by the currents induced in conductive parts of the magnet assembly. This causes the resultant magnetic field prevailing externally of the magnet assembly to remain substantially within or close to the said preset limits for normal operation.

The transient condition of most interest is quenching of the coils to cause them to come out of their superconducting state.

The ring can take the form of a conductive hoop, band or coil, and there can be several such rings so sized and positioned that their combined magnetic effect during a quench maintains the external field within the preset limits. The rings can be mounted on any convenient cylindrical surface.

If the first and second superconducting coils are wound on respective first and second conductive formers, the ring(s) can be located around either or both of the first and second formers and supported thereby. If the superconducting coils are housed within radiation shielding casings, the ring or rings may be mounted on these casings. To achieve the required low temperatures for superconductivity, the first and second formers can be housed in a helium container, itself surrounded by a vacuum chamber. The rings could then be mounted on either the helium container or the vacuum chamber.

DESCRIPTION OF THE PREFERRED EMBODIMENTS

Figure 1:
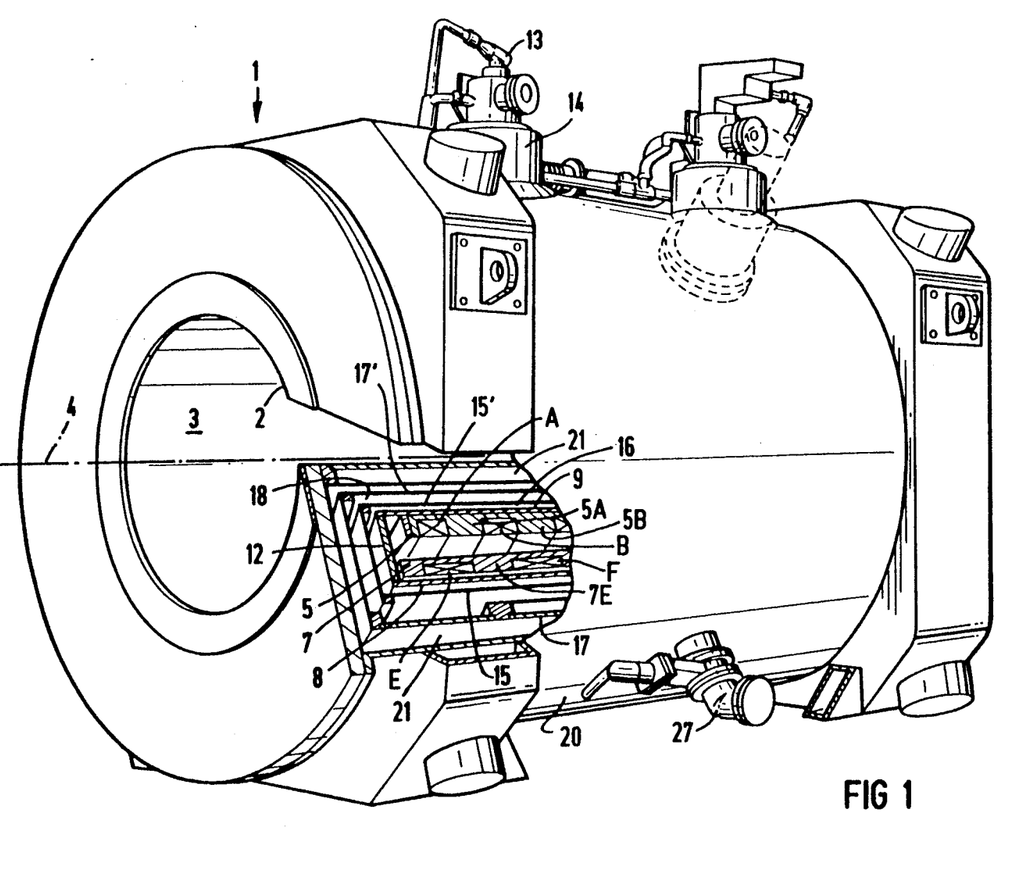
FIG. 1 is a perspective view, partly broken away view of an example of a magnet assembly constructed in accordance with the principles of the present invention.

FIG. 1 illustrates in partly broken away form a magnet assembly 1. The magnet assembly 1 has an inner, cylindrical former 2 made of stainless steel defining the working volume of the magnet assembly constituted by a bore 3 having an axis 4. Positioned radially outwardly of the former 2 is a cylindrical, aluminum former 5 coaxial with the axis 4. The former 5 carries three pairs of coils A and A', B and B', C and C' arranged symmetrically about a mid-plane 6 (see FIG. 2) of the assembly normal to the axis 4 and a seventh coil D arranged symmetrically relative to the mid-plane 6. These coils can be seen in FIG. 2. Each of the coils A-D is formed of a superconductive conducting material for example, fine strands of alloy Type II superconductor, a matrix of a good normal conductor in which the superconductor strands are embedded in the form of a regular array, and a surface electrical insulation to cope with energization and fault mode voltages. Each of the coils A-D is wound separately. The coils are embedded in a wax or epoxy composition and may be surrounded by a clamping ring (not shown). In addition each pair of coils is positioned between respective pairs of annular ribs 5A and 5B etc. of the former 5. The purpose of the wax or epoxy composition and the ribs is to prevent movement of the windings of the coil in use such as any small movements which might be accompanied by the generation of a small amount of heat which could lead to quenching. In view of the close spacing of the coils A-D, the former 5 must be constructed to accommodate large forces between adjacent coils which, in the axial direction, can amount to some 200,000 Kgf. In addition, the former 5 must be as light as possible to reduce the overall weight of the magnet assembly and be as close to a right cylinder as possible.

A second, aluminum former 7 is mounted radially outwardly of the former 5. The former 7 carries four shielding coils E and E'-F and F' (see FIG. 2) arranged symmetrically about the mid-plane 6 of the magnet assembly in a manner to be described below. The coils E-F' are mounted between respective pairs of ribs 7E and 7F of the former 7 in a way similar to the coils A-D. Clamping rings (not shown) and wax or epoxy are used to reduce movement of the coil windings as described above in relation to the former 5.

In order that the windings of the coils A-F' can achieve their superconductive condition it is necessary to cool the windings to about 4.2K. This is the boiling point of helium and thus the two formers 5 and 7 are positioned within a helium can defined by an outer cylindrical wall 8 and an inner cylindrical wall 9. The helium can is closed by a pair of ring members 12. The walls 8 and 9 and ring members 12 are all made of stainless steel. Liquid helium is supplied to a helium can via an inlet 13 mounted in a turret 14. The helium can could alternatively be made of a material having a higher conductivity than that of stainless steel, for example aluminum.

Cylindrical, aluminium radiation shields 15 and 15' are mounted coaxially, radially outwardly and inwardly respectively about the helium can to define an evacuated space 16 between the shields 15 and 15' and the helium can. The shields 15 and 15' are cooled by contact with helium through the agency of a heat exchanger (not shown) in the turret 14 which extracts heat from the radiation shields 15 and 15' and passes it to the cold helium gas that has been boiled from the helium can.

Further cooling of the shields to achieve a lower temperature may be achieved by a second heat exchanger connected to the second stage of a closed-cycle Gifford-McMahon refrigerator.

Further aluminum radiation shields 17 and 17' are mounted coaxially, radially outwardly and inwardly respectively about the shields 15 and 15' to define an evacuated space 18. In use, liquid nitrogen is supplied to an annular tank 26 of which the shield 17 forms the skin. These shields may be connected through a heat exchanger to the first stage of a two-stage closed cycle Gifford-McMahon refrigerator which has sufficient cooling power to reduce or eliminate the boil off of nitrogen from the tank. Finally, a cylindrical stainless steel outer casing 20 is mounted coaxially about the shield 17 to define a vacuum space 21. The outer casing 20 could alternatively be formed of aluminum. Pairs of aluminum end plates 22, 23 and 24 (see FIG. 2) are provided to close the ends of the spaces 16, 18 and 21.

To minimize the heat load, the various shields are supported by a system of glass reinforced plastic rods (not shown) mounted in corresponding attachment plates. These rods when configured as a three dimensional array of struts, will support a 4000 kilogram magnet with a heat leak (loss) of no more than 0.04 watts.

In use, the helium can defined by walls 8 and 9 is filled with liquid helium which will be at 4.21K. As the liquid helium boils, the gas produced will pass into the heat exchanger in the turret 14 which will cool the shields 15 and 15' to a temperature of about 40K (referred to as the 40K heat shield). The boiling of the liquid helium maintains the wall of the helium can at 4.2K. Liquid nitrogen being present in the tank maintains the shields 17 and 17' at a temperature of about 77K (referred to as the 80K heat shield). These cold shields together with the vacuum contained within the spaces 16, 18 and 21 help to minimize the heat input to the helium can at 4.2K.

The spaces 16, 18 and 21 are connected through a valve 27 to the atmosphere to enable the spaces to be evacuated.

In another implementation the nitrogen tank 26 may be omitted when the shields 15 and 17 are cooled by a two-stage Gifford-McMahon closed cycle refrigerator.

Figure 2:
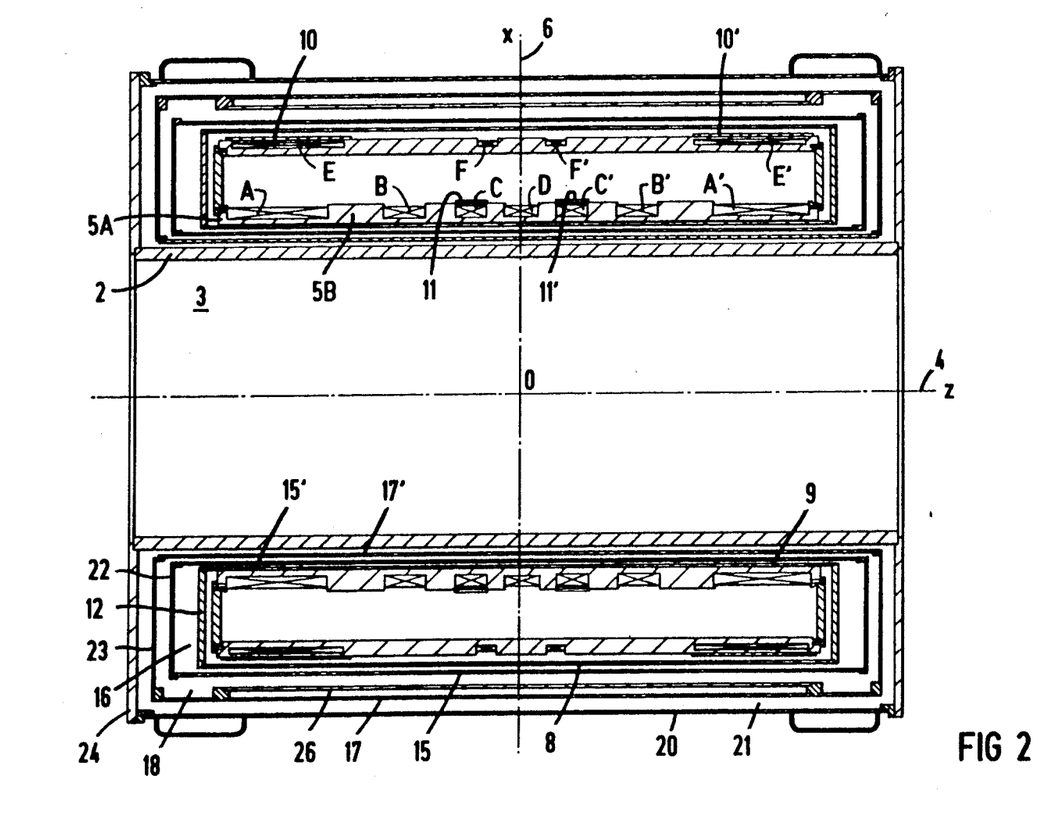
FIG. 2 is a longitudinal section of the assembly of FIG. 1.

The position of the components of the magnet system 1 may be better understood by reference to FIG. 2 which shows a radial cross-section through the assembly.

Figure 3:
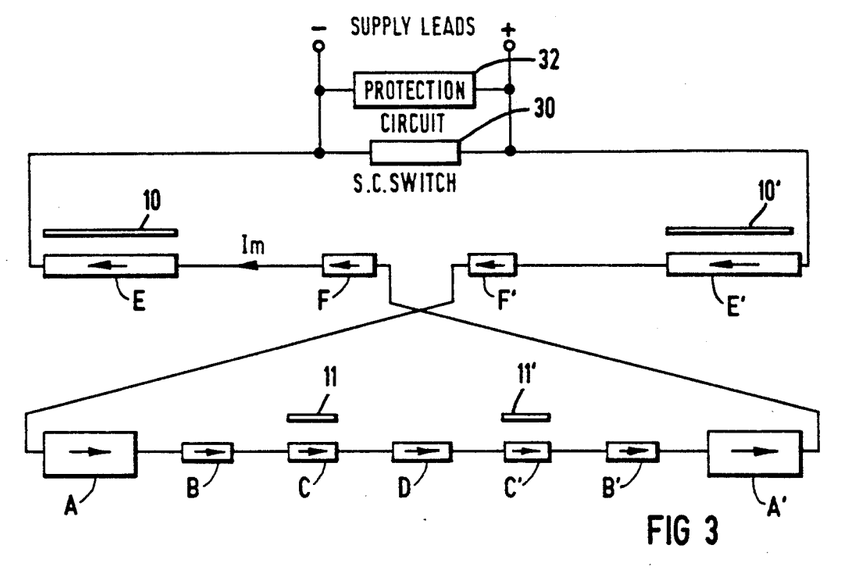
FIG. 3 is a circuit diagram for the assembly of FIG. 2.

As can be seen best from the circuit diagram of FIG. 3, the coils A-F' are all connected in series with each other so that the same current flows in each. The coils are connected in a closed circuit with a switch 30. A protection circuit 32 is connected across the switch 30.

In the steady state condition, no current flows in the formers 5 and 7 on which the superconducting coils for the magnet are wound. Calculations made for the magnetic field of the inner coil system A-D and the outer coil system E and F to ensure that one acts in opposition to the other in the area outside the magnet assembly to keep the stray field within preset limits do not need to take into account the effect of the formers. These calculations do not form directly part of the present invention and will not be discussed in detail herein. Reference is made to EP-A-0144171 in this regard.

In a transient state, however, the above no longer holds true. In this state, large currents can be induced in the formers 5 and 7 and shields 15 and 15', and 17 and 17' which create large and rapidly changing magnetic fields which serve to destroy the calculated opposition balance outside the magnetic assembly 1. If the helium can and outer casing are made of aluminum, these too can present a significant contribution. The effect of this is to rapidly increase the stray field of the system, affecting people and equipment in a zone which would, in a steady state condition, be designated safe.

To overcome this effect the invention provides in the described embodiment a set of rings of conductive material sized and placed so that the current induced in the rings in a transient condition creates a magnetic field which acts in substantial opposition to the magnetic field created by the current induced in the formers, thereby preventing the stray field exceeding preset limits. In the illustrated example, four rings 10 and 10', 11 and 11' are located respectively radially outwardly of the coils C and C' and E and E'.

The rings are manufactured of high conductivity oxygen-free copper with a residual resistivity ratio of approximately 70. The residual resistivity ratio is the ratio of the resistivity at 300K to the resistivity at 4.2K. They are located coaxially with the coils using dowel pins to prevent movement when large forces are present during a quench.

In the general sense, the size and position of the ring(s) can be calculated as follows.

Figure 4:
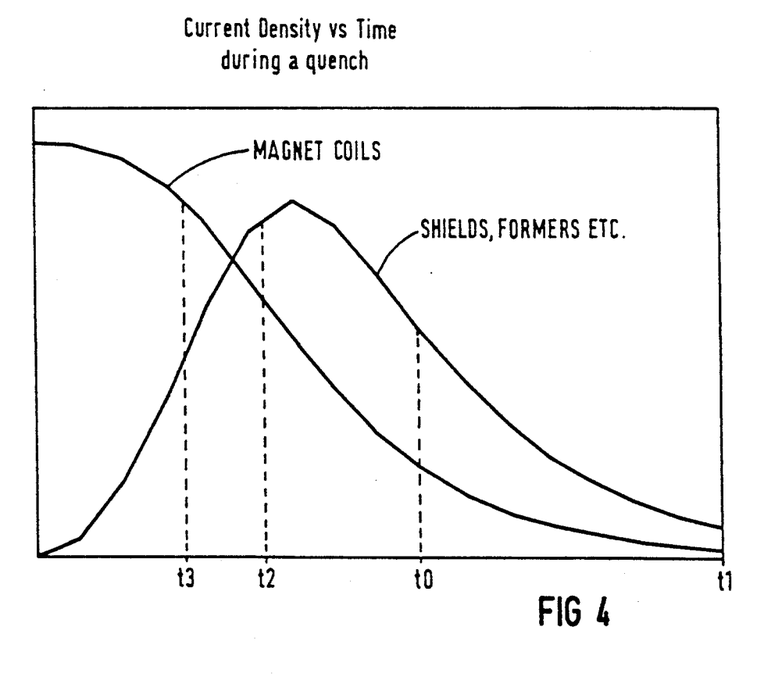
FIG. 4 illustrates the variation in current in the superconducting coils and formers in the assembly of FIG. 1 as a function of time during a quench.

The transient condition of most concern is a quench, either intentionally or unintentionally produced. In order to calculate the design parameters of the rings it is first necessary to know approximately the time-dependent variation in the coil current as the quench proceeds. This can be determined experimentally, by observing the change in the central magnetic field during a quench, or more conveniently by simulation using a suitable computer program. FIG. 4 shows schematically the variation with time of the current $I_m$ in the magnet coils and the current in the radiation shields $I_f$ during a quench, from initiation of the quench at $t=0$. The result is used as a source function for a finite-element transient analysis computer program such as PE2D which can be obtained from Vector Fields Limited. The cryostat, the magnet formers 5 and 7 and the coils A-F' are modeled as an axisymmetric construction with the initial coil current set to its normal steady value. That is, the symmetry of the assembly is such that the system can be represented by a quarter-section, defined by the axes OX and OZ. This quarter-section is used as the basis for these calculations. The analysis proceeds step-by-step, calculating the distribution of current in all the conductive elements at predetermined time intervals, and the corresponding values of the magnetic field throughout the whole of space.

Such a calculation cannot be done easily using conventional methods of calculating mutual inductances because of the highly non-uniform current distribution in the conducting components. A problem which remains in the finite element analysis is the extreme temperature dependence of resistivity of nearly pure materials at the low temperatures encountered within the cryostat, which makes it difficult to take full account of the effect of increased temperature due to the induced currents. For most practical alloys used in such a structure however, the temperature dependence is low enough and the induced temperature rise small enough to allow an average value to give a good approximation.

Figure 5:
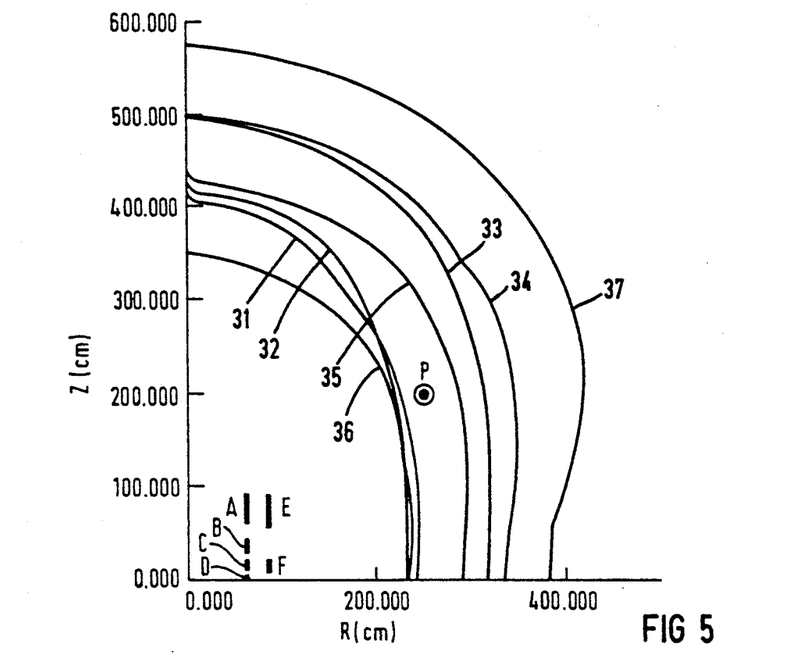
FIG. 5 shows the calculated position of the 0.5 mT stray field contour at different times after the quench, without conductive rings in accordance with the invention.

The result of such a calculation is shown in FIG. 5. The curve 31 in FIG. 5 represents where the modulus of magnetic flux density $B_{mod}$ is 0.5 mT when the magnet is energized to a steady field of 1.0 T at the center O. The curves 32-36 show where the same 0.5 mT flux density is expected to be at intervals of 3 seconds in chronological order after the initiation of a quench when the rings 10-11' are not fitted to the magnet assembly. The curve 37 shows where the flux density is 0.1 mT 15 seconds after the initiation of the quench.

Having thus calculated the size of the problem a first estimate of the size and position of the ring(s) can be determined using the following steps.

1. Estimate the size of the magnetic dipole moment $m_f$ of the formers creating the excess stray field. As is known a magnetic dipole moment is a measure of the strength of a magnet taking into account the value of the field and its extent. It has been demonstrated from curves such as FIG. 5 that, to a first approximation, valid at dimensions large compared with the dimensions of the magnet and cryostat, a curve of constant magnetic flux density $B_{mod}$, where $$B^2_{mod} = B_x^2 + B_y^2 + B_z^2$$

is an ellipsoidal surface of radius r and axial length $l_a$ given by:

$$l_a/r = 2 \times 2^{\frac{1}{2}} \tag{1}$$

the length la being in the direction of the axis of the magnet. The radius r is related to magnetic dipole moment m and flux density $B_{mod}$ by $$r^3 = (m\mu_o)/(4\pi B_{mod}) \quad (2)$$

where $\mu_o$ is the permeability of a vacuum.

The magnetic dipole moment $m_f$ is estimated by superimposing a surface of shape given by Equation (1) onto a map of curves of magnetic flux density $B_{mod}$ produced from the calculation, as shown in FIG. 5. The best fit to a constant value of $B_{mod}$ over this surface is then obtained after extracting the contribution of the magnet coils themselves. This can be done most conveniently at time intervals approaching $t_o$ (FIG. 4), denoting the end of the quench, at which point the contribution of the magnetic coils to the magnet field is small but the contribution of the current induced in the formers $I_f$ is still significant. The value of r thus obtained at selected value of $B_{mod}$ is substituted in Equation (2) to give the equivalent magnetic dipole moment.

Using the value of the curve 37 in FIG. 5, the magnetic dipole moment giving rise to this field is approximately:

$$m_f = (4\pi B_{mod} r^3)/\mu_o = 7.7 \times 10^4 Am^2.$$

Analysis of the field direction shows that the stray field direction is in the same sense as to an unshielded magnet (i.e. that formed by coils A–D), indicating that the most significant induced currents are in the same sense as those in the inner coils A,A'–D.

This calculation can be repeated at many intervals during the quenching progress to determine how the magnetic dipole moment $m_f$ varies with time due to the different time-constants of different parts of the system. It is particularly useful to derive the time constant for decay of current in the formers after termination of the quench ($t_o - t_1$) and the worst case of stray field, which occurs around the time $t_2$ when currents in both the formers 5 and 7 and the coils A–F' are contributing to the stray field.

2. The object of the invention is to have a total magnetic dipole moment m as close to zero as possible. The principle of the invention is to generate by induction in a ring or rings an equal and opposite magnetic dipole moment to that calculated in step 1.

It is preferable to design the ring to have a simple cross-section of limited area so that a uniform current density within the ring is a reasonable approximation. Also for a first estimate the currents induced in the formers 5 and 7 and shields 15 and 15', and 17' and 17, (and the helium can and the outer casing if made of a conductive material) can be ignored for the purpose of calculating the coupling to the rings as they are much less significant than the decaying current $I_m$ in the magnet coils. The circuit equation for the coupling between the magnet coils A–F' and the ring 10 (FIG. 2) is then given by:

$$L_r \frac{dI_r}{dt} + M \frac{dI_m}{dt} + I_r R = 0 \quad (3)$$

Where:
$L_r$ is the self-inductance of the ring
M is the mutual inductance between the magnet coils and the ring 10
R is the resistance of the ring
$I_r$ is the instantaneous current in the ring and
$I_m$ is the instantaneous current in the magnet coils
and the corresponding magnet dipole moment of one ring $m_r$ assuming a single turn of a wire, is:

$$m_r = I_r \pi a^2 \quad (4)$$

where a is the radius of the ring.

For the general case where $I_m$ is not a simple function of time, equation (3) must be solved numerically. However, for a first approximation $I_m$ can be assumed to have the form of an exponential decay in the area of importance. This can be seen from FIG. 4, where $t_3$ indicates the beginning of the zone of importance. Thus, $$I_m = I_o \exp(-t/\tau_m) \quad (5)$$

where $\tau_m$ is a decay time constant determined from the curve of FIG. 4, so that equation (3) has a solution $$I = (MI_o)(R\tau_m - L_r)^{31} {}^1(\exp(-t/\tau_m) - \exp(R\tau/L_r)) \quad (6)$$

or by rearranging $$I = I_o K (L_m/L_r)^{178}$$
$$(\tau_m/\tau_r - 1)^{-1}(\exp(-t/\tau_m) - \exp(R\tau/L_r)) \quad (7)$$

where:
K is the coupling constant between magnet and ring $$K^2 = M^2/L_r L_m,$$

$\tau_r$ is the time-constant of the decay of current in the ring $$\tau_r = L_r/R$$

$L_m$ is the self-inductance of the magnet, and
$I_o$ is the current in the magnet coils before a quench.
This function has a maximum value with respect to time given by:

$$I_{max} = I_o K (L_m \tau_r / L_r \tau_m)^{\frac{1}{2}} (1 - \tau_r/\tau_m)^{-1} \quad (8)$$

occurring at time $$t = (\tau_m \tau_r)(\tau_m - \tau_r)^{-1} l_n(\tau_m/\tau_r) \quad (9)$$

For completeness, it is noted that in the special case when $\tau_m = \tau_r = \tau$ the equation numbered (3) has a solution $$I = (I_o K t/\tau)(L_m/L_r)^{\frac{1}{2}} \exp(-t/\tau)$$

with a maximum value $$I_{max} = (I_o K/e)(L_m/L_r)^{\frac{1}{2}}$$

at $t = \tau$.

The general expressions (4),(7),(8) and (9) can be utilized to determine the size and position of the rings. The fixed parameters are $L_m$ the magnet inductance, the initial magnet current $I_o$, and the effective time constant $\tau_m$ for the run-down of the magnet. The variable parameters $\tau_r, L_r$ and K can be selected to achieve a value of $I_r$ such that $m_r = -m$, where $m_r$ is derived from Equation 4 thereby to achieve an approximately zero dipole moment throughout the period of interest.

The parameters $\tau_r$ and $L_r$ serve to indicate the preferred size and shape of the ring.

The self-inductance $L_r$ of a ring is a strong function of the radius a and a relatively weak function of its cross-sectional shape. The time constant $\tau_r$ is determined by the self inductance $L_r$ and the resistance R, the latter being proportional to cross-sectional area and material conductivity. The cross-sectional area of the ring can be determined by the thickness of the material or cross-sectional shape.

The coupling factor K can be adjusted by changing the radial and axial position of the ring relative to the magnet coils. The radial distance from the magnet coil is affected by the radius a. By manipulating these variables, the number, size and location of rings can be determined for any particular case.

3. Once a solution has been selected according to steps 1 and 2, the design of the rings is fed back into the finite-element model used initially to determine the magnitude of the effect. On re-analyzing the problem, with the same source function, a different distribution of magnetic field over time will result. If this solution is not entirely satisfactory it can be used as the basis for a further estimate, resulting either in a change of design of the rings or the addition of extra rings to augment or counter the effect of the first rings.

This process can be iterated many times if necessary in order to achieve an optimum solution in terms of stray field performance and also cost and complexity of manufacturing and installing the rings.

Any or all of the available parameters can be adjusted in the design, but it is convenient to fix the radius a of the ring as just larger than an existing cylindrical surface, for ease of construction and assembly, and to fix the thickness of the ring at a commonly available stock material size, or multiple thereof. A wide choice of material resistivity is available by selecting suitable materials, such as oxygen-free, high-conductivity copper, and also by choosing an appropriate location to achieve a desired temperature. For example, the shield 15 will be at about 40K while the shield 17 will be at about 80K. The electrical time constant of the ring $\tau_r$ can then be adjusted by varying the cross-sectional area of the ring which affects R, and the coupling to the magnet coils by changing the axial extent and position of the rings.

In the illustrated case, for which the magnet coil details are entered in Table 1, the solution of the first analysis indicated two rings 10 and 10' to couple with coils E and E'. It proved convenient for rings 10 and 10' to completely span the coils E and E' for ease of fixing, resulting in a value for K which causes overcompensation. This overcompensation can be reduced by the addition of two rings 11 and 11' over the inner coils C and C'. The dimensions and position of the rings are as follows:

| BAND | AXIAL POSITION (cm) | AXIAL LENGTH (mm) | INSIDE DIAMETER (mm) | THICKNESS (mm) |
|---|---|---|---|---|
| 10 | 75 | 400 | 1740 | 6 |
| 11 | 10 | 100 | 1200 | 6 |

Both rings are constructed of oxygen free, high conductivity copper with a residual resistivity ratio between 70 and 100. In the example they are rolled from flat plate or strip with the ends welded to form a single hoop. An alternative implementation would be to wind coils using wire and joining the ends to form a closed loop. More generally, high-conductivity copper in the form of rolled plate or wire and having a residual resistivity ratio over 30 is suitable, as is high-purity aluminum in the form of rolled plate or wire strip. Other high-conductivity metals may also be suitable.

Figure 6:
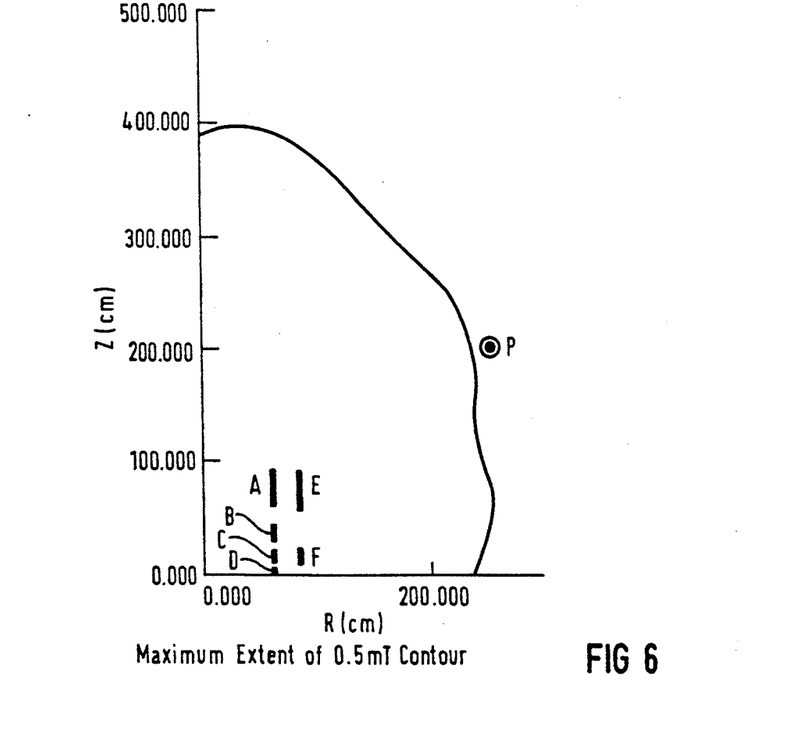
FIG. 6 shows the calculated position of the 0.5 mT stray field contour at different times after the quench for the embodiment of FIG. 2.
Figure 7:
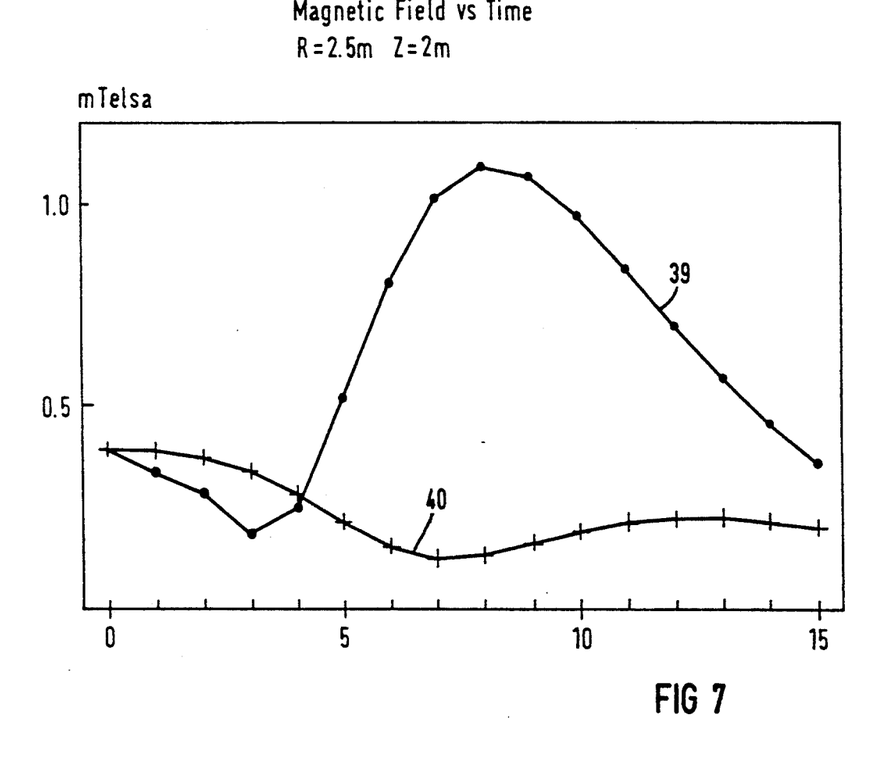
FIG. 7 compares the magnetic field at a fixed point, marked P in FIGS. 5 and 6, as a function of time after the quench for each of the cases illustrated in FIGS. 5 and 6.

The effect is shown in FIG. 6, where the curve 38 encloses all points at which the field exceeds 0.5 mT at any time during the quench. It is shown further by FIG. 7, where the magnetic flux density at the point marked P on FIG. 5 and 6 is shown as a function of time during the quench both with (curve 40) and without (curve 39) the bands in place.

TABLE 1

| COIL | MEAN RADIUS (CM) | WIDTH (CM) | AXIAL POSITION (CM) | NO. OF TURNS |
|---|---|---|---|---|
| D | 59.47 | 15.98 | 0.00 | 756 |
| C | 60.17 | 8.58 | 18.02 | 696 |
| B | 60.01 | 15.39 | 39.78 | 1040 |
| A | 60.37 | 27.82 | 78.90 | 2820 |
| F | 84.60 | 7.40 | 14.15 | 600 |
| E | 85.08 | 30.78 | 75.39 | 1872 |

Although further modifications and changes may be suggested by those skilled in the art, it is the intention of the inventors to embody within the patent warranted hereon all changes and modifications as reasonably and properly come within the scope of their contribution to the art.

I claim as my invention:

1. A magnet assembly comprising:

first superconducting coil means for generating a first magnetic field;

second superconducting coil means for generating a second magnetic field, said first and second superconducting coil means being electrically connected in series and respectively generating magnetic fields having corresponding components of substantially the same order of magnitude;

said first and second superconducting coil means, in combination, generating a resultant uniform magnetic field in a working volume with said second magnetic field substantially opposing said first magnetic field in a combined magnetic field externally of said working volume;

said first and second superconducting coil assemblies maintaining said combined magnetic field externally of said working volume within preset limits during normal operation in which the current in said first and second superconducting coils is substantially constant; and electrically conductive ring means having a size and position relative to said working volume for, during a transient condition in which said current in said first and second superconducting coils is changing, generating a magnetic field opposing magnetic fields created by currents induced in conductive parts surrounding said working volume, for maintaining said combined magnetic field externally of said working volume substantially within said preset limits for normal operation.

2. A magnet assembly as claimed in claim 1 further comprising first and second formers on which said first and second superconducting coils are respectively wound, said first and second formers being coaxially disposed with respect to each other.

3. A magnet assembly as claimed in claim 2 wherein said ring means is mounted on said first former.

4. A magnet assembly as claimed in claim 2 wherein said ring means is mounted on said second former.

5. A magnet assembly as claimed in claim 1 further comprising a radiation shielding casing containing said first and second superconducting coils.

6. A magnet assembly as claimed in claim 5 wherein said ring means is mounted on said radiation shielding casing.

7. A magnet assembly as claimed in claim 1 further comprising a plurality of radiation shielding casings containing said first and second superconducting coils and radially spaced from said first and second superconducting coils.

8. A magnet assembly as claimed in claim 1 wherein said ring means consists of a material from the group comprising high-conductivity copper and high-purity aluminum.

9. A magnet assembly as claimed in claim 1 further comprising:
first and second coaxially disposed formers on which said first and second superconducting coils are respectively wound; a container of helium in which said first and second former and said first and second coils are housed, said ring means being mounted on said container.

10. A magnet assembly as claimed in claim 9 further comprising a vacuum chamber disposed externally of said container of helium.

11. A method for operating a magnet assembly for preventing a magnetic field externally of a working volume exceeding preset limits during a transient condition, said method comprising the steps of:
generating a first magnetic field using a first superconducting coil;
generating a second magnetic field using a second superconducting coil electrically connected in series with said first superconducting foil, the magnetic fields generated respectively by said first and second superconducting coils having corresponding components of substantially the same order of magnitude;
said first and second magnetic fields, in combination, forming a resultant uniform magnetic field in a working volume with said second magnetic field substantially opposing said first magnetic field in a combined magnetic field externally of said working volume;
maintaining said combined magnetic field externally of said working volume within preset limits during normal operation, by means of said first and second superconducting coils, in which the current in said first and second superconducting coils is substantially constant; and
controlling currents induced in conductive parts surrounding said working volume during a transient condition, in which said current in said first and second superconducting coils is changing, by generating a magnetic field, using an electrically conductive ring, which opposes magnetic fields created by said currents induced in said conductive parts for maintaining said combined magnetic field externally of said working volume substantially within said present limits for normal operation during said transient condition.

* * * * *